US008559153B2

(12) United States Patent
Feucht

(10) Patent No.: US 8,559,153 B2
(45) Date of Patent: Oct. 15, 2013

(54) CIRCUIT CONFIGURATION FOR THE JOINT PULSE WIDTH MODULATION OF VALVES WITH QUENCHING

(75) Inventor: Thomas Feucht, Wimsheim (DE)

(73) Assignee: Knorr-Bremse Systeme fuer Nutzfahrzeuge GmbH, Munich (DE)

( * ) Notice: Subject to any disclaimer, the term of this patent is extended or adjusted under 35 U.S.C. 154(b) by 314 days.

(21) Appl. No.: 12/448,230

(22) PCT Filed: Dec. 11, 2007

(86) PCT No.: PCT/EP2007/063733
§ 371 (c)(1),
(2), (4) Date: Jun. 12, 2009

(87) PCT Pub. No.: WO2008/071713
PCT Pub. Date: Jun. 19, 2008

(65) Prior Publication Data
US 2010/0013303 A1    Jan. 21, 2010

(30) Foreign Application Priority Data

Dec. 13, 2006   (DE) .......................... 10 2006 058 725

(51) Int. Cl.
*H01H 47/14* (2006.01)
*H02H 3/08* (2006.01)
*H02H 9/02* (2006.01)

(52) U.S. Cl.
USPC ..................................... 361/168.1; 361/93.1

(58) Field of Classification Search
USPC ..................................... 361/168.1, 160, 93.1
See application file for complete search history.

(56) References Cited

U.S. PATENT DOCUMENTS 5,621,604 A * 4/1997 Carlson .......................... 361/166

FOREIGN PATENT DOCUMENTS

| DE | 12 75 192 | 8/1968 |
| DE | 196 32 365 | 9/1997 |
| DE | 100 15 647 | 10/2001 |
| DE | 101 50 752 | 4/2003 |
| EP | 0 452 562 | 10/1991 |

OTHER PUBLICATIONS

European Patent Office, International Preliminary Report on Patentability and Written Opinion, Jun. 25, 2009, from International Patent Application No. PCT/EP2007/063733, filed on Dec. 11, 2007.
European Patent Office, Translation of International Preliminary Report on Patentability and Written Opinion, Jul. 16, 2009, from International Patent Application No. PCT/EP2007/063733, filed on Dec. 11, 2007.

* cited by examiner

*Primary Examiner* — Rexford Barnie
*Assistant Examiner* — Christopher Clark
(74) *Attorney, Agent, or Firm* — Kenyon & Kenyon LLP

(57) ABSTRACT

A circuit configuration is provided for switching valves with joint pulse width modulation and quenching, having a first switch to which a pulse width modulation is applied for controlling magnetic fields of a plurality of valve inductors connected to the circuit configuration; a plurality of second switches by which the circuit configuration is able to be switched between a slow and a rapid quenching of the magnetic fields of the inductors; and a diode which is in the conducting state when the second switches are in a switching state for a slow quenching of the magnetic fields of the inductors, and which is no longer parallel to the inductors when the second switches are in a switching state for a rapid quenching of the magnetic fields of the inductors.

13 Claims, 2 Drawing Sheets

CIRCUIT CONFIGURATION FOR THE JOINT PULSE WIDTH MODULATION OF VALVES WITH QUENCHING

FIELD OF THE INVENTION

The present invention relates to a circuit configuration for the joint pulse width modulation of valves with quenching and, in particular, relates to a circuit configuration for the joint pulse width modulation of a plurality of individually switched valves with joint slow quenching.

BACKGROUND INFORMATION

Solenoid valves as a type of valves known per se are used in vehicles, for instance, commercial vehicles, which may be for converting electrical control pulses to, inter alia, hydraulic or pneumatic control pulses for controlling automatically or electronically controlled gear units, for example, or electronic brake systems.

In practical applications of that kind, as a rule, the valves are operated with the aid of a circuit configuration in a control unit with a pulse width modulation, the circuit configuration having a switchover possibility for a rapid and slow quenching, i.e., a rapid or slow de-energizing of the magnetic field in the coils of the valves. Until now, if several valves were present, several such circuit configurations would have to be used corresponding to the number of valves.

FIG. 2 shows, in simplified form, a known circuit configuration for the pulse width modulation and quenching of a single solenoid valve.

The known circuit configuration according to FIG. 2 essentially includes a first switch S0, a second switch S1, an inductor L1 representing the coil of the solenoid valve and a diode D1, a supply line V for the voltage supply of the circuit device, a feedback line R for feeding back a state of the circuit configuration to a control device (not shown), and a line PWM for the input of a pulse width modulation into the circuit configuration via first switch S0.

Going into detail, second switch S1 and diode D1 are interconnected in series in a first branch of the circuit configuration, and this series interconnection is interconnected in parallel with inductor L1, disposed in a second branch of the circuit configuration, between supply line V and feedback line R. The parallel interconnection with inductor L1 on one hand and second switch S1 and diode D1 on the other hand is then connectable to a ground potential M via first switch S0 to which the pulse width modulation is applied.

The disadvantages in the known circuit configuration, which is requisite in this form for each inductor L1 to be controlled in a solenoid valve, are, in particular, that two switches S0, S1 are necessary for each inductor L1, that only one shutdown path is available per inductor L1, and that at the instant the magnetic field of the inductor is shut down, a synchronization of the two switches S0, S1 is necessary.

This disadvantageously results, therefore, in increased expenditure for components as well as a more complex control, which particularly in the vehicle sector, is reflected in undesirably high costs and high development expenditure. In addition, a higher number of components in the overall system involves a higher risk of breakdown, and can thereby lead to decreased economic efficiency of the vehicle.

Moreover, the prior publication DE 101 50 752 A1 describes a valve driver, in which a valve coil, a disconnect device and a switching device are arranged serially and a freewheeling device is arranged in parallel with respect to the valve coil and the disconnect device. In this configuration, the pulse width modulation is switched off through the switching device in response to a high-speed de-excitation of the valve coil by way of the disconnect device, so that in each case, only one valve coil is able to be de-excited at high speed, and therefore a separate valve driver continues to be necessary for each valve coil.

SUMMARY OF THE INVENTION

Therefore, an object of the exemplary embodiments and/or exemplary methods of the present invention is to reduce the number of circuit configurations required, and therefore the expenditure for components to drive installed valves, and at the same time to provide an automatic switchover between a slow and a rapid quenching upon a de-energizing of the valves.

According to the exemplary embodiments and/or exemplary methods of the present invention, this objective is achieved by the features set forth herein.

Advantageous further developments of the invention are the subject matter of the further description herein.

Therefore, the object of the exemplary embodiments and/or exemplary methods of the present invention is achieved by a circuit configuration for the switching of valves with joint pulse width modulation and quenching, including a first switch to which a pulse width modulation is applied for controlling magnetic fields of a plurality of valve inductors connected to the circuit configuration; and a diode which is in the conducting state when the second switches are in a switching state for a slow quenching of the magnetic fields of the inductors, and which is not in the quenching circuit when the second switches are in a switching state for a rapid quenching of the magnetic fields of the inductors, characterized by a plurality of second switches by which the circuit configuration is able to be switched over between a slow and a rapid quenching of the magnetic fields of the inductors, in doing which, the second switches switching the magnetic fields of the inductors jointly, group-wise or individually between the slow and the rapid quenching.

Advantageously, therefore, for each inductor representing a coil of a solenoid valve, in each case one second switch is provided by which the current supply to the inductors is able to be switched in or disconnected individually, group-wise or jointly for all inductors, and only one shared suppressor diode is provided for all inductors, which brings about a slow or a rapid quenching of the magnetic field of the inductor to be quenched, depending on the switching state of one of the second switches. In this context, in the case of the slow quenching of the magnetic field, the pulse-width-modulation operation does not need to be interrupted, and a synchronization of the first switch with respective second switches is not necessary. A first shutdown path is made available via the second switches, and a second shutdown path is made available via the first switch.

To generate the joint pulse width modulation, the first switch may be driven via a pulse-width-modulation input line, and to switch over between the slow and the rapid quenching of the magnetic fields of the inductors, the plurality of second switches are driven via control lines for each of the second switches by way of a control device.

Further, a feedback line for feeding back the state of the first and of the individual second switches may be provided at the first and at each of the second switches, and the control device detects a fault condition of the first and of the individual second switches based on the state signaled back.

Advantageously, in each case, one of the second switches and one of the inductors are interconnected in series; a plurality of the second switches and inductors interconnected in series are interconnected in parallel between a voltage-supply line and a first terminal of the first switch; the diode between the voltage-supply line and the first terminal of the first switch is interconnected in parallel to the parallel-interconnected series connections of the second switches and inductors; and a second terminal of the first switch is connected to a ground potential of the circuit configuration.

In an open state of the second switches, a rapid quenching, and in a closed state of the second switches, a slow quenching of the magnetic fields of the inductors may take place.

Likewise, the pulse width modulation applied to the first switch may clock the circuit configuration with a frequency between 1 and 10 kHz.

The first switch and the second switches are advantageously field-effect transistors.

It is further advantageous that, in the case of the slow quenching of a magnetic field of an inductor, the first switch and a corresponding second switch may remain unsynchronized, and the pulse width modulation may continue to be applied to the first switch, uninterrupted.

The diode and the first switch are expediently dimensioned in such a way that the total current flowing through the inductors in the individual circuit states of the circuit configuration is able to be transmitted non-destructively.

In the following, the exemplary embodiments and/or exemplary methods of the present invention is described in greater detail based on exemplary embodiments with reference to the drawings.

DETAILED DESCRIPTION

Figure 1:
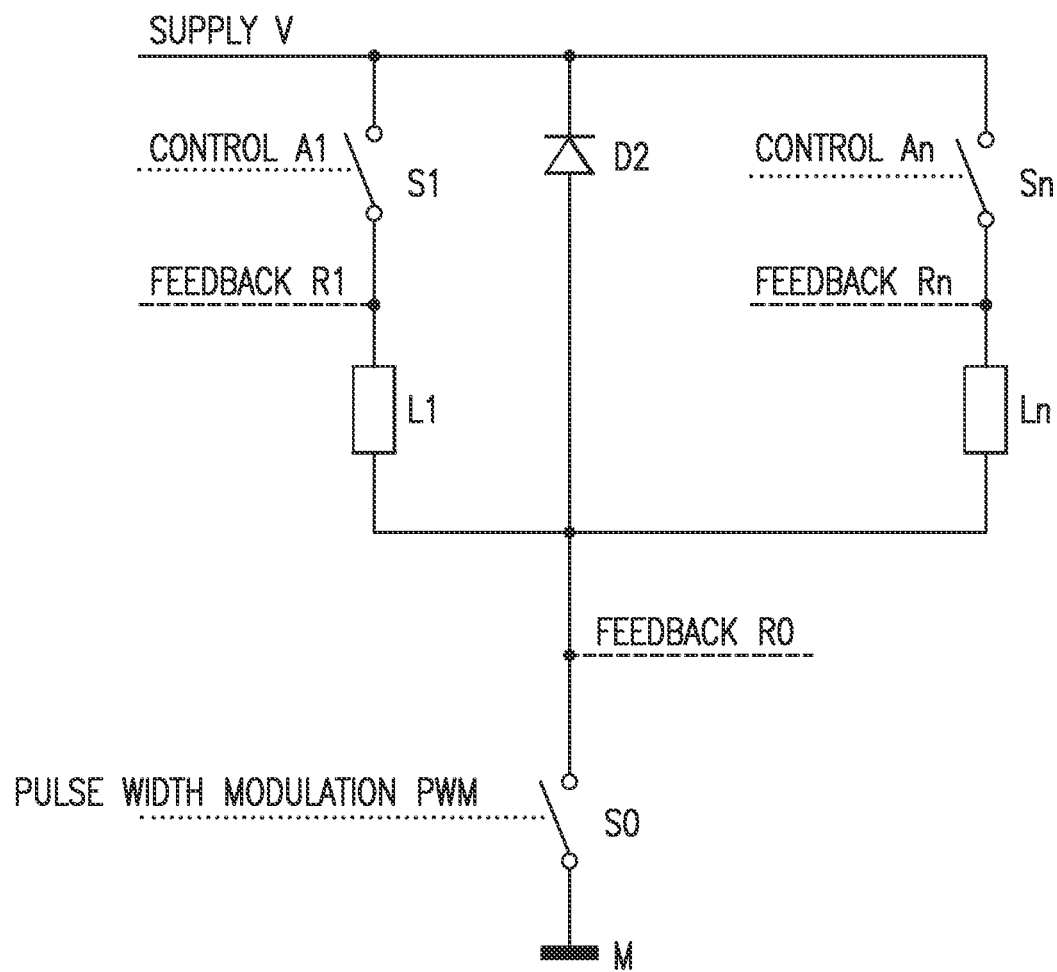
FIG. 1 shows, in simplified form, a circuit configuration for the joint pulse width modulation of solenoid valves with joint slow quenching according to one exemplary embodiment.
Figure 2:
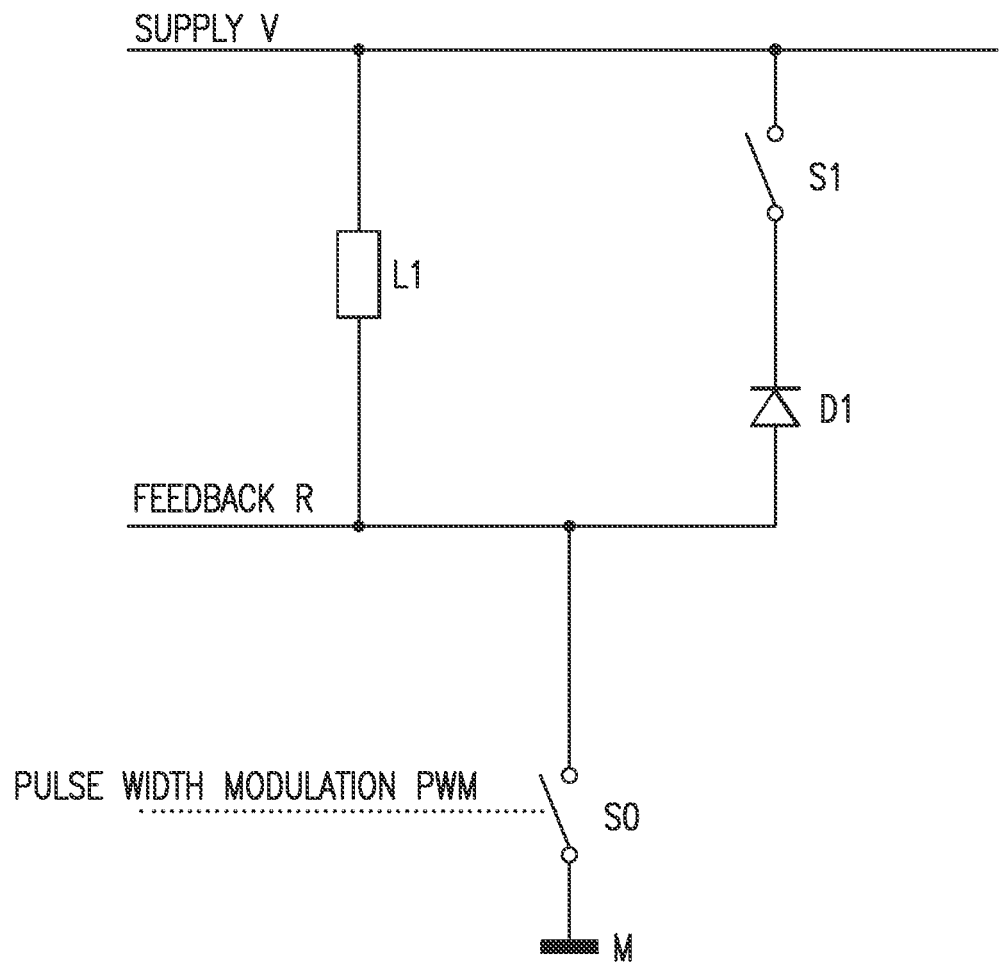
FIG. 2 shows, in simplified form, a known circuit configuration for the pulse width modulation and quenching of a single solenoid valve.

FIG. 1 shows, in simplified form, a circuit configuration for the joint pulse width modulation of solenoid valves with joint slow quenching according to one exemplary embodiment.

The circuit configuration illustrated in FIG. 1 is suitable for any solenoid valves in practical applications in which magnets are to be switched alternately or simultaneously, and may be used in automatic or electronic transmission controls or electronic brake systems. The circuit configuration according to FIG. 1 essentially includes a supply line V for the voltage supply, control lines A1 through An for controlling second switches S1 through Sn, feedback lines R1 through Rn for the feedback of states of the circuit configuration to a control device such as a control unit (not shown), coils or inductors L1 through Ln, second switches S1 through Sn, n being a whole number, a diode D2, a feedback line R0, a first switch S0, a pulse-width-modulation input line PWM for applying a pulse width modulation to switch S0, and a ground connection M at a ground potential, e.g., a vehicle ground.

Going into detail, a number of series connections, which corresponds to the number n of coils or inductors in solenoid valves to be switched, and which in each case are made up of one of second switches S1 through Sn and one of inductors L1 through Ln that represent the coils of the solenoid valves to be switched, are interconnected in parallel between supply line V and a first terminal of first switch S0. Moreover, a diode D2 between supply line V and the first terminal of first switch S0 is interconnected in parallel to these parallel-interconnected series connections (S1 through Sn, L1 through Ln). In the closed state, first switch S0 connects inductors L1 through Ln, second switches S1 through Sn and diode D2 in the afore-mentioned parallel branches of the circuit configuration, to ground connection M.

In other words, the circuit configuration is basically made up of first switch S0 which generates the pulse width modulation for all valves or inductors L1 through Ln, and diode D2 which brings about the slow quenching of the solenoid valves, and second switches S1 through Sn which are used for the supply of inductors L1 through Ln and for the automatic switchover between a slow and a rapid quenching of the magnetic fields of the individual valves.

The basic functioning method of the circuit configuration shown in FIG. 1 is such that, when a second switch S1 through Sn is closed, a valve connected to it is operated via first switch S0 with pulse width modulation and slow quenching or slow de-energizing of the magnetic field of the solenoid-valve coils, and when a second switch S1 is open, the corresponding valve is de-energized quickly, since diode D2 acting as suppressor diode and freewheeling diode is no longer effective.

If no diode D2 functioning as a freewheeling diode were provided, only a rapid quenching of the valve-coil magnetic fields by opening second switches S1 through Sn would be possible, with high kick-back pulses afterwards, since the pulse width modulation, which, by a variation of the ratio of ON duration to OFF duration, permits a control of the power in the magnet of the solenoid valve, leads to a fast clocking of the solenoid valves in the range between, e.g., 1 and 10 kHz, which may be between 6 and 7 kHz, and thereby to a rapid energizing and de-energizing of the valve-coil magnetic fields with correspondingly strong mutual induction.

However, by providing diode D2, the coil currents of connected inductors L1 through Ln in the respective switched-off phase, i.e., during the OFF duration of the pulse width modulation accompanied by closed second switches S1 through Sn, are able to flow onward across this diode D2, which is then conductive, and only change slowly, so that the valve-coil magnetic fields only change or decay slowly, as well.

Thus, diode D2 ensures that the energy stored in the coil of the solenoid valve does not decrease too rapidly in the switched-off state during the pulse-width-modulation operation, that is, during the desired closed-loop control of the solenoid valve, and in this manner, the valve is retained in the desired position.

On the other hand, if the pulse-width-modulation operation, and consequently the desired closed-loop control of the solenoid valve, is to be brought to an end, e.g., for the purpose of switching off the solenoid valve, then a rapid de-energizing, i.e., quenching of the valve-coil magnetic field is desired. For this purpose, diode D2 must therefore be disconnected. This is accomplished individually for each inductor L1 through Ln or jointly for all inductors L1 through Ln with the aid of second switches S1 through Sn.

In particular, this is also carried out when the pulse-width-modulation operation via first switch S0 is continued and not interrupted, even upon opening of second switches S1 through Sn, so that a synchronization of first switch S0 and second switches S1 through Sn is not necessary for the de-energizing of the valve-coil magnetic fields.

It should be noted that second switches S1 through Sn may be in the form of field-effect transistors. Moreover, diode D2 may be a fast-switching diode and dimensioned in such a way with respect to its maximum power loss that it is able to non-destructively conduct the current flowing through the coils of the solenoid valves in the switch-off case. It may be that, given simultaneous switching of all solenoid valves by driving second switches S1 through Sn via control lines A1 through An, a limited number of concurrently switchable coils thereby results, or measures must be taken to the effect that not all existing solenoid valves are switched simultaneously, but rather group-wise or individually, i.e., singly. However, through suitable measures, a high degree of freedom exists with respect to design, properties and parameters when working with the circuit configuration proposed. The same also holds true in principle for first switch S0, which may likewise take the form of a field-effect transistor.

Feedback lines R0 through Rn make it possible for the control device (not shown) to detect a fault condition, that is, the operativeness of respective first and second switches S0 through Sn, feedback line R0—because of the average potential generated by the pulse width modulation—also representing a virtual ground, and therefore ensuring a constant voltage across individual coils/inductors L1 through Ln of the solenoid valves.

It should be noted that inductors L1 through Ln of the solenoid valves may be disposed both externally and, e.g., in the case of electronic brake systems, internally in the solenoid-valve body.

In accordance with the above description of an exemplary embodiment, the exemplary embodiments and/or exemplary methods of the present invention provides the following arrangements for achieving the objective and correctives for the disadvantages of known configurations.

Only one suppressor diode, i.e., diode D2, is required for a plurality of valves, and only one first switch S0 is required for generating the pulse width modulation.

An automatic switchover is provided between slow and rapid quenching of the magnetic field of a coil of a solenoid valve.

A second shutdown path is made available.

Overall, therefore, owing to the proposed circuit configuration, a substantial decrease in the expenditure for structural elements and component parts is achieved by combining a plurality of solenoid valves to be switched. At the same time, the circuit configuration is not limited to a certain type of valves, but rather may be used for any valves to be switched electrically or electronically.

Structural implementations which are similar to the description detailed herein are not to be judged as a departure from the subject matter of the exemplary embodiments and/or exemplary methods of the present invention.

The Reference Numeral List (FIG. 1) is as follows:
V shared supply line
R0 through Rn feedback lines
A1 through An control lines
S0 first switch
S1 through Sn second switches
L1 through Ln inductors (solenoid-valve coils)
D2 diode
PWM pulse-width-modulation input line
M ground potential

What is claimed is:

1. A circuit configuration for switching valves with joint pulse width modulation and quenching, comprising:
a first switch, to which a pulse width modulation is applied for controlling magnetic fields of a plurality of valve inductors connected to the circuit configuration; and
a diode, which is in a conducting state when a plurality of second switches are in a switching state for a slow quenching of the magnetic fields of the inductors, and which is not in a quenching circuit when the second switches are in a switching state for a rapid quenching of the magnetic fields of the inductors;
wherein the plurality of second switches operates so that the circuit configuration is able to be switched between a slow and a rapid quenching of the magnetic fields of the inductors, and wherein the second switches switch the magnetic fields of the inductors one of jointly, group-wise, and individually between the slow and the rapid quenching,
wherein the plurality of second switches and a blocking terminal of the diode are connected to a common supply line, wherein there is a plurality of feedback lines, each being between each of the second switches and a corresponding one of the inductors, and wherein there is a feedback line between the inductors and the first switch, and
wherein the plurality of feedback lines, each being between each of the second switches and the corresponding ones of the inductors and the feedback line between the inductors and the first switch, are feedback lines for feeding back the state of the first switch and each of the second switches, and the control device detects a fault condition of the first and of the individual second switches based on the state signaled back.

2. The circuit configuration of claim 1, wherein to generate the joint pulse width modulation, the first switch is driven via a pulse-width-modulation input line, and wherein to switch over between the slow and the rapid quenching of the magnetic fields of the inductors, the plurality of second switches are driven via control lines for each of the second switches by a control device.

3. The circuit configuration of claim 1, wherein:
in each case, one of the second switches and one of the inductors are interconnected in series,
a plurality of the second switches and inductors interconnected in series are interconnected in parallel between a voltage-supply line and a first terminal of the first switch,
the diode between the voltage-supply line and the first terminal of the first switch is interconnected in parallel to the parallel-interconnected series connections of the second switches and inductors, and
a second terminal of the first switch is connected to a ground potential of the circuit configuration.

4. The circuit configuration of claim 1, wherein in an open state of the second switches, a rapid quenching, and in a closed state of the second switches, a slow quenching of the magnetic fields of the inductors takes place.

5. The circuit configuration of claim 1, wherein the pulse width modulation applied to the first switch clocks the circuit configuration with a frequency between 1 and 10 kHz.

6. The circuit configuration of claim 1, wherein the first switch and the second switches are field-effect transistors.

7. The circuit configuration of claim 1, wherein in the case of the slow quenching of a magnetic field of an inductor, the first switch and a corresponding second switch are unsynchronized, and the pulse width modulation continues to be applied to the first switch, uninterrupted.

8. The circuit configuration of claim 1, wherein the diode and the first switch are dimensioned so that a total current flowing through the inductors in the individual circuit states of the circuit configuration is transmittable non-destructively.

9. A circuit configuration for switching valves with joint pulse width modulation and quenching, comprising:
a first switch, to which a pulse width modulation is applied for controlling magnetic fields of a plurality of valve inductors connected to the circuit configuration; and a diode, which is in a conducting state when a plurality of second switches are in a switching state for a slow quenching of the magnetic fields of the inductors, and which is not in a quenching circuit when the second switches are in a switching state for a rapid quenching of the magnetic fields of the inductors;

wherein the plurality of second switches operates so that the circuit configuration is able to be switched between a slow and a rapid quenching of the magnetic fields of the inductors, and wherein the second switches switch the magnetic fields of the inductors one of jointly, groupwise, and individually between the slow and the rapid quenching, wherein the plurality of second switches and a blocking terminal of the diode are connected to a common supply line, wherein there is a plurality of feedback lines, each being between each of the second switches and a corresponding one of the inductors, and wherein there is a feedback line between the inductors and the first switch, and wherein to generate the joint pulse width modulation, the first switch is driven via a pulse-width-modulation input line, and wherein to switch over between the slow and the rapid quenching of the magnetic fields of the inductors, the plurality of second switches are driven via control lines for each of the second switches by a control device, and wherein the plurality of feedback lines, each being between each of the second switches and the corresponding ones of the inductors and the feedback line between the inductors and the first switch, are feedback lines for feeding back the state of the first switch and each of the second switches, and the control device detects a fault condition of the first and of the individual second switches based on the state signaled back.

10. The circuit configuration of claim 9, wherein:
in each case, one of the second switches and one of the inductors are interconnected in series, a plurality of the second switches and inductors interconnected in series are interconnected in parallel between a voltage-supply line and a first terminal of the first switch, the diode between the voltage-supply line and the first terminal of the first switch is interconnected in parallel to the parallel-interconnected series connections of the second switches and inductors, and a second terminal of the first switch is connected to a ground potential of the circuit configuration.

11. The circuit configuration of claim 1, wherein in an open state of the second switches, a rapid quenching, and in a closed state of the second switches, a slow quenching of the magnetic fields of the inductors takes place, and wherein the pulse width modulation applied to the first switch clocks the circuit configuration with a frequency between 1 and 10 kHz, and wherein the first switch and the second switches are field-effect transistors.

12. The circuit configuration of claim 11, wherein in the case of the slow quenching of a magnetic field of an inductor, the first switch and a corresponding second switch are unsynchronized, and the pulse width modulation continues to be applied to the first switch, uninterrupted, and wherein the diode and the first switch are dimensioned so that a total current flowing through the inductors in the individual circuit states of the circuit configuration is transmittable non-destructively.

13. The circuit configuration of claim 1, wherein in the case of the slow quenching of a magnetic field of an inductor, the first switch and a corresponding second switch are unsynchronized, and the pulse width modulation continues to be applied to the first switch, uninterrupted, and wherein the diode and the first switch are dimensioned so that a total current flowing through the inductors in the individual circuit states of the circuit configuration is transmittable non-destructively.

\* \* \* \* \*

UNITED STATES PATENT AND TRADEMARK OFFICE
CERTIFICATE OF CORRECTION

PATENT NO. : 8,559,153 B2 Page 1 of 1
APPLICATION NO. : 12/448230
DATED : October 15, 2013
INVENTOR(S) : Thomas Feucht It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 346 days.

Signed and Sealed this

Fifteenth Day of September, 2015

Michelle K. Lee
*Director of the United States Patent and Trademark Office*